United States Patent [19]
Mita et al.

[11] Patent Number: 5,614,843
[45] Date of Patent: Mar. 25, 1997

[54] CMOS-PECL LEVEL CONVERSION CIRCUIT

[75] Inventors: Shinji Mita; Tadahiro Kuroda, both of Yokohama, Japan

[73] Assignee: Kabushiki Kaisha Toshiba, Kawasaki, Japan

[21] Appl. No.: 583,510

[22] Filed: Jan. 5, 1996

[30] Foreign Application Priority Data

Jan. 9, 1995 [JP] Japan .................................. 7-001504

[51] Int. Cl.$^6$ ................................................ H03K 19/003
[52] U.S. Cl. .............................. 326/73; 326/33; 326/68; 326/115
[58] Field of Search .................................. 326/33–34, 68, 326/69, 73, 115

[56] References Cited

U.S. PATENT DOCUMENTS

| | | | |
|---|---|---|---|
| 4,437,171 | 3/1984 | Hudson et al. ............................ | 326/73 |
| 4,999,519 | 3/1991 | Kitsukawa et al. ...................... | 326/110 |
| 5,149,992 | 9/1992 | Allstot et al. .......................... | 326/27 X |
| 5,241,225 | 8/1993 | Okajima et al. ......................... | 326/73 X |
| 5,264,744 | 11/1993 | Mizukami et al. ..................... | 326/72 X |
| 5,311,075 | 5/1994 | Usuki ........................................ | 326/73 |
| 5,365,127 | 11/1994 | Manley ..................................... | 326/73 |

OTHER PUBLICATIONS

Steyaert et al., "ECL–CMOS and CMOS–ECL Interface in 1.2-μm CMOS for 150-MHz Digital ECL Data Transmission Systems", IEEE J. of Solid–State Circuits, vol. 26, No. 1, pp. 18–23 & 226–227, (1991).

*Primary Examiner*—David R. Hudspeth
*Attorney, Agent, or Firm*—Foley & Lardner

[57] ABSTRACT

A level conversion circuit is provided which can obtain a stable output voltage, with keeping low power consumption and a high speed operation, if manufacturing processes and operational conditions of the LSI'S are varied. The level conversion circuit comprising a first input portion for receiving a first CMOS level signal as a differential signal at the CMOS level and a second CMOS level signal as an inverted signal of the first CMOS level signal, and outputting a first output current and a second output current based on these signals, a first conversion output portion for outputting a first PECL level signal as the PECL level differential signal and a second PECL level signal as an inverted signal of the first PECL level signal based on the first output current and the second output current from the first input portion, and a first current control portion for controlling the first output current and the second output current in the first conversion output portion by a first current control signal and a second current control signal so as to determine high level and low level in the first PECL level signal and the second PECL level signal.

8 Claims, 6 Drawing Sheets

CMOS-PECL LEVEL CONVERSION CIRCUIT

BACKGROUND OF THE INVENTION

1. Field of the Invention

The present invention relates to a level conversion circuit which is utilized in a PECL (Pseudo-ECL) interface serving as a small amplitude interface etc. to convert a voltage level from a CMOS level to a PECL level.

2. Description of the Prior Art

Figure 1:
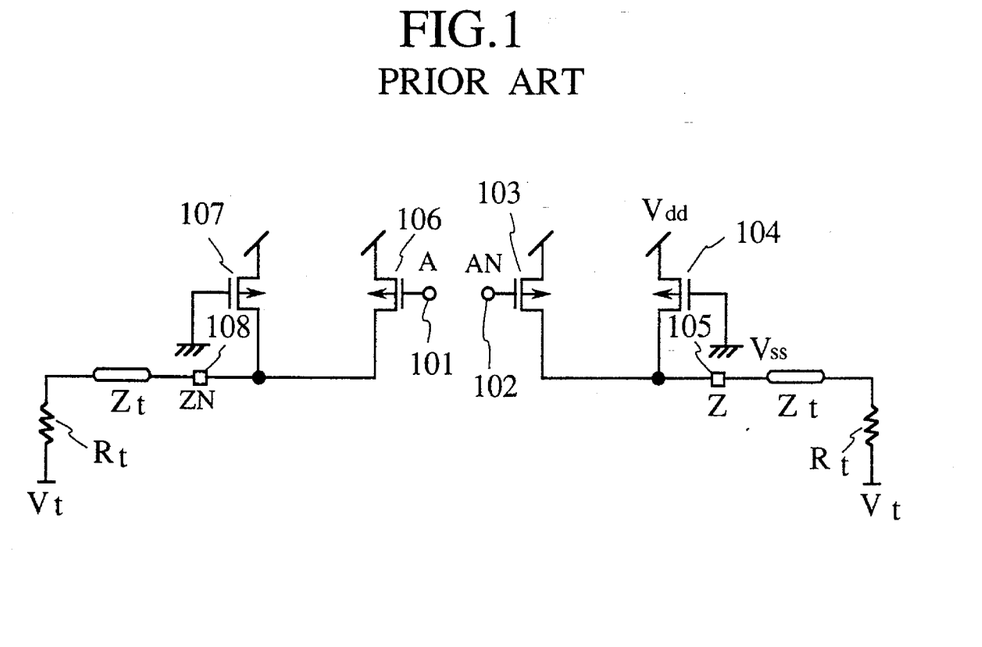
FIG. 1 is a circuit diagram showing a configuration of the conventional CMOS-PECL level conversion circuit.

Conventionally, as the level conversion circuit of this kind, there has been the circuit shown in FIG. 1 for purposes of example. FIG. 1 is a circuit diagram illustrating a configuration of the conventional CMOS-PECL level conversion circuit.

The CMOS-PECL level conversion circuit includes input terminals 101, 102 to which differential signals A, AN (inverted signal of A) at the CMOS level (0 V to 5 V) are applied respectively. A gate of a P channel MOS transistor (referred to as "P-MOS" hereinafter) 103 is connected to the input terminal 102. The P-MOS 103 as well as the P-MOS 104 is also connected between the power source Vdd (5 V) and an output terminal 105.

A gate of a P-MOS 106 is similarly connected to the input terminal 101. The P-MOS 106 together with a P-MOS 107 is connected between the power source Vdd and an output terminal 108. In addition, a power source Vt (3 V) is connected respectively to the output terminals 105, 108 via resistors Rt. The resistors Rt are impedance-matched respectively with characteristic impedances Zt of transmission lines.

Differential signals Z, ZN (inverted signal of Z) at the PECL level (3.3 V to 4.1 V) would be output respectively from the output terminals 105, 108. It will be assumed hereinafter that a current will be defined as Iol when the signals Z, ZN at the PECL level of "L" level are output, and that a current will also be defined as Ioh when the signals Z, ZN at the PECL level of an "H" level are output.

The P-MOS's 104, 107 are always in a normal ON state, and the transistor size (i.e., gate width) of them is so adjusted that the current Iol may flow therethrough. While the transistor size of the P-MOS's 103, 106 is so adjusted that a current Ioh–Iol which being derived by subtracting the current Iol from the current Ioh may flow therethrough when the P-MOS's 103, 106 are turned ON.

When the CMOS level signals A (="L" level), AN (="H" level) are input into the input terminals 101, 102, the P-MOS 103 is turned OFF while the P-MOS 106 is turned ON. Therefore, the current output from the output terminal 105 reaches the Iol, and the PECL level signal Z at an "L" level is thus output. The current output from the output terminal 108 reaches the Ioh, and the PECL level signal ZN at an "H" level is thus output.

On the contrary, when the CMOS level signals A (="H" level), AN (="L" level) are input into the input terminals 101, 102, then in the same manner as above the PECL level signal Z at an "H" level is output from the output terminal 105 while the PECL level signal ZN at an "L" level is output from the output terminal 108.

As discussed before, the CMOS level differential signals may be converted into the PECL level differential signals.

However, in the conventional level conversion circuit as above, since desired output currents and voltages may be determined by the transistor size, there has been such a drawback that an output voltage would be varied significantly when manufacturing processes of LSI's, operational conditions such as power source voltage, temperature, characteristic impedance of the transmission line, etc. are varied.

SUMMARY OF THE INVENTION

The present invention has been made under the above circumstances, and an object of the present invention is therefore to provide a level conversion circuit capabling of obtaining a stable output voltage including lessened fluctuation even when manufacturing processes and operational conditions of the LSI's are varied.

Another object of the present invention is to provide a level conversion circuit capabling of obtaining a stable output voltage including lessened fluctuation and performing a high speed operation even when operational conditions of the LSI's are varied.

Still another object of the present invention is to provide a level conversion circuit capabling of obtaining a stable output voltage, with keeping low power consumption and a high speed operation, even when manufacturing processes and operational conditions of the LSI's are varied.

In order to attain the above objects, according to an aspect of the present invention, there is provided a level conversion circuit for converting CMOS level differential signals into PECL level differential signals comprising a first input portion for receiving a first CMOS level signal as a differential signal at said CMOS level and a second CMOS level signal as an inverted signal of said first CMOS level signal, and outputting a first output current and a second output current based on these signals; a first conversion output portion for outputting a first PECL level signal as said PECL level differential signal and a second PECL level signal formed as an inverted signal of said first PECL level signal based on said first output current and said second output current from said first input portion; and a first current control portion for controlling said first output current and said second output current in said first conversion output portion by a first current control signal and a second current control signal so as to determine a high level and a low level in said first PECL level signal and said second PECL level signal.

In a preferred embodiment, the level conversion circuit further comprises, a second input portion, a second conversion output portion, and a second current control portion, all being formed to have respectively the same configurations as those of said first input portion, said first conversion output portion, and said first current control portion; a first signal generating means for generating a first feedback signal based on a third PECL level signal output from said second conversion output portion; a second signal generating means for generating a second feedback signal based on a fourth PECL level signal output as an inverted signal of said third PECL level signal from said second conversion output portion; and a replica bias circuit formed to feed back said first feedback signal and said second feedback signal to said second current control portion, and to employ an input signal supplied to said second input portion as a first power source and a second power source; wherein said first feedback signal and said second feedback signal output from said replica bias circuit may serve respectively as said first current control signal and said second current control signal.

According to another aspect of the present invention, there is provided a level conversion circuit comprising, a first switching transistor and a second switching transistor connected respectively between a first node and a common node and a second node and said common node, for effecting ON/OFF operations alternately based on a first CMOS level signal serving as a CMOS level differential signal and a second CMOS level signal formed as an inverted signal of said first CMOS level signal; a first conversion output portion for outputting a first PECL level signal of PECL level differential signals to a first output node depending upon a current flowing through said first node; a second conversion output portion for outputting a second PECL level signal formed as an inverted signal of said first PECL level signal to a second output node depending upon a current flowing through said second node; a first current control transistor for controlling a current to flow through said common node based on a first current control signal; a second current control transistor for controlling a current to flow through said first node based on a second current control signal; and a third current control transistor for controlling a current to flow through said second node based on said second current control signal.

In another preferred embodiment, the level conversion circuit further comprises, a third switching transistor and a fourth switching transistor, a fourth current control transistor through a sixth current control transistor, and a third conversion output portion and a fourth conversion output portion all being formed to have respectively the same configurations as those of said first switching transistor and said second switching transistor, said first current control transistor through said third current control transistor, and said first conversion output portion and said second conversion output portion; a first signal generating means for generating a first feedback signal based on a third PECL level signal output from said third conversion output portion to a third output node; a second signal generating means for generating a second feedback signal based on a fourth PECL level signal output as an inverted signal of said third PECL level signal from said fourth conversion output portion to a fourth output node; and a replica bias circuit formed to feed back said first feedback signal to a control electrode of said fourth current control transistor and said second feedback signal to control electrodes of said fifth current control transistor and said sixth current control transistor, and to connect respectively a first power source and a second power source to respective control electrodes of said third switching transistor and said fourth switching transistor; wherein said first feedback signal output from said replica bias circuit is supplied as said first current control signal to a control electrode of said first current control transistor, and said second feedback signal is supplied as said second current control signal to respective control electrodes of said second current control transistor and said third current control transistor respectively.

In still another preferred embodiment, the level conversion circuit further comprises, a first low power consumption transistor connected between said first power source and said first output node, conduction of said first low power consumption transistor being controlled based on said second CMOS level signal; and a second low power consumption transistor connected between said first power source and said second output node, conduction of said second low power consumption transistor being controlled based on said first CMOS level signal; wherein said replica bias circuit comprises a third low power consumption transistor connected between said first power source and said third output node and formed to have the same configuration as that of said first low power consumption transistor, a control electrode of said third low power consumption transistor being connected to said second power source; and a fourth low power consumption transistor connected between said first power source and said fourth output node and formed to have the same configuration as that of said second low power consumption transistor, a control electrode of said fourth low power consumption transistor being connected to said first power source. Here the first, second, third and fourth low power consumption transistors are formed to have the same configuration.

In yet still another preferred embodiment, control electrodes of said first low power consumption transistor through said fourth low power consumption transistor are connected to said second power source.

According to still another aspect of the present invention, there is provided a level conversion circuit for receiving CMOS level differential signals from a first input terminal and a second input terminal and converting said CMOS level differential signals into PECL level differential signals to output from a first output terminal and a second output terminal comprising, a first CMOS inverter connected between a first power source and a common node, for receiving one of said CMOS level differential signals as an input signal; a first current mirror circuit having an input current terminal connected to an output terminal of said first CMOS inverter and an output current terminal connected to said first output terminal; a second CMOS inverter connected between said first power source and said common node, for receiving the other of said CMOS level differential signals as an input signal; a second current mirror circuit having an input current terminal connected to an output terminal of said second CMOS inverter and an output current terminal connected to said second output terminal; a first current control transistor connected between said common node and a second power source, for controlling a current flowing through said common node based on a first current control signal; a first output transistor connected between said first power source and said first output terminal, conduction of said first output transistor being controlled based on a first current control signal; and a second output transistor connected between said first power source and said second output terminal, conduction of said second output transistor being controlled based on a second current control signal.

According to yet still another aspect of the present invention, there is provided a physical layer controller for an ATM communication control apparatus comprising, a signal transfer processing section for receiving transmission data from upper data link layers and converting said transmission data into pulse trains at CMOS level to output them at a predetermined transfer rate; and a CMOS-PECL level conversion circuit for converting said pulse trains at CMOS level from said signal transfer processing section into pulse trains at PECL level to output them as differential signals; wherein said CMOS-PECL level conversion circuit comprises a first input portion for receiving a first CMOS level signal as said differential signals at CMOS level and a second CMOS level signal formed as an inverted signal of said first CMOS level signal and outputting a first current and a second current based on said first CMOS level signal and said second CMOS level signal; a first conversion output portion for outputting a first PECL level signal as said PECL level differential signals and a second PECL level signal formed as an inverted signal of said first PECL level signal based on a first output current and a second output current from said first input portion; and a first current control portion for controlling a first output current and a second output current from said first conversion output portion by a first current control signal and a second current control signal to determine high level and low level of said first PECL level signal and said second PECL level signal respectively.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF THE EMBODIMENTS

Embodiments of the present invention will be explained in detail with reference to the drawings from FIGS. 2 to 7 hereinafter. Here a CMOS-PECL level conversion circuit built in an ATM communication control apparatus will be explained for purposes of example. Of course, it will be understood that the CMOS-PECL level conversion circuit discussed hereinafter may be applied to other applications with no variation or any appropriate variations as the case may be.

Figure 2:
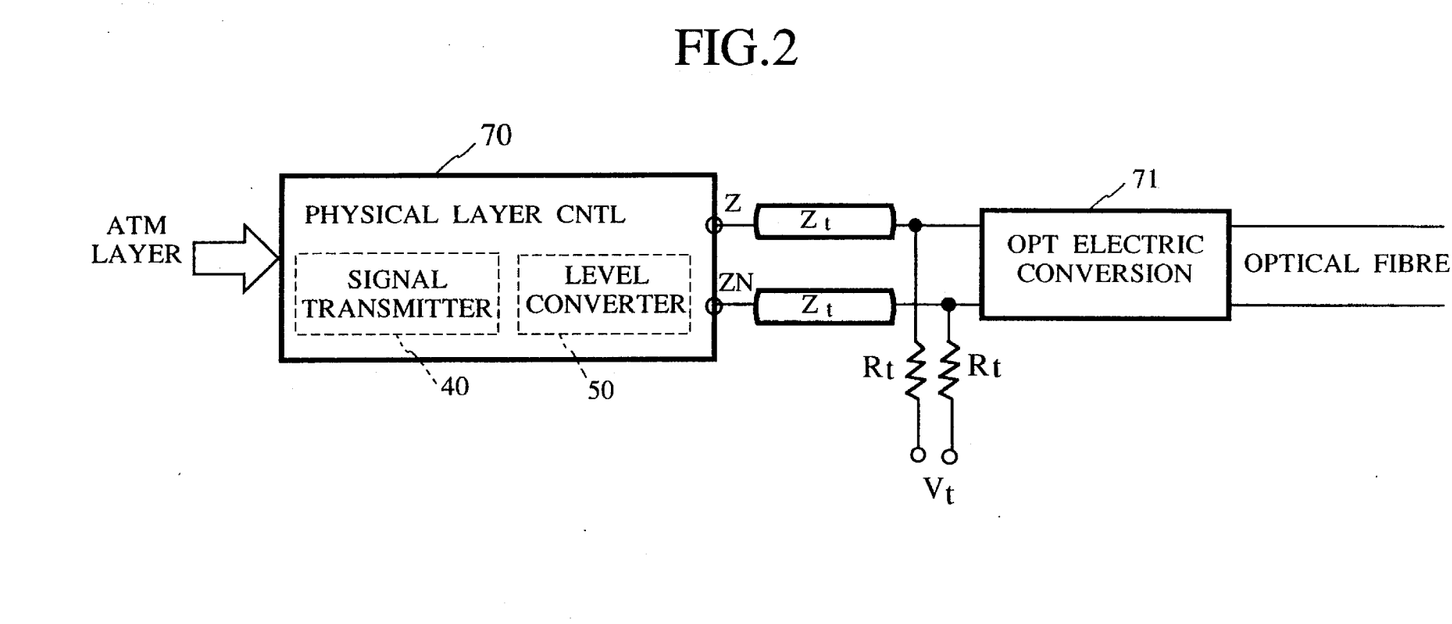
FIG. 2 is a block diagram showing an output portion of an ATM communication control apparatus employing a level conversion circuit according to the present invention.

FIG. 2 shows a schematic configuration of an output portion of an ATM communication control apparatus connected to an optical cable. A physical layer controller 70 for treating the lowest level process in protocol processing layers of the ATM is formed of one chip LSI constituting a CMOS circuit. The physical layer controller 70 comprises a signal transfer processing portion 40 for receiving transmission data from an upper data link layer and then converting them into pulse trains at the CMOS levels to output them at a predetermined transfer rate, and a CMOS-PECL level conversion circuit 50 serving as a PECL interface. The CMOS-PECL level conversion circuit 50 converts the pulse trains which are transferred from the signal transfer processing portion 40 and have the CMOS levels of 5 V and 0 V into the pulse trains which have the PECL levels of 4.1 V and 3.3 V, and then outputs them from complementary output terminals Z, ZN as differential signals.

The differential signals output from the CMOS-PECL level conversion circuit 50 are input into a photoelectric conversion circuit 71 via a transmission line Zt and in turn converted into optical signals there so as to transmit to an optical fiber. To respective input terminals of the photoelectric conversion circuit 71 are respectively connected resistors Rt which are to be impedance-matched with characteristic impedance Zt of the transmission line.

Figure 3:
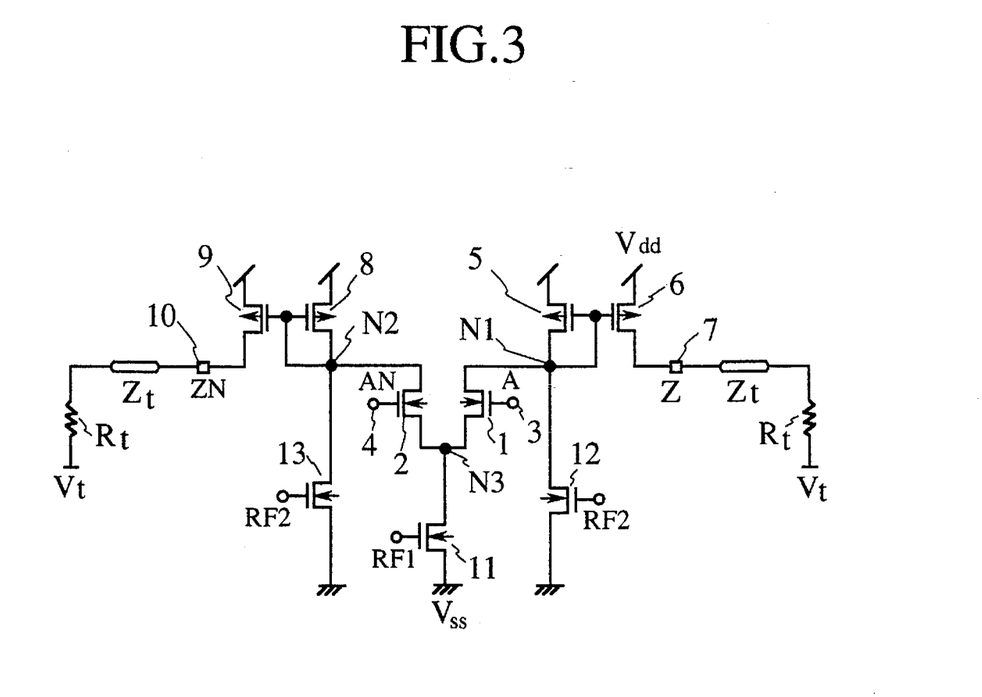
FIG. 3 is a circuit diagram showing a level conversion circuit according to a first embodiment of the present invention.

FIG. 3 is a circuit diagram showing a CMOS-PECL level conversion circuit according to a first embodiment of the present invention. The CMOS-PECL level conversion circuit comprises an output portion of the physical layer controller 70 depicted in FIG. 2.

The level conversion circuit converts CMOS level differential signals into PECL level differential signals. The level conversion circuit comprises N channel MOS transistors (referred to as "N-MOS" hereinafter) 1, 2 constituting respectively a first switching transistor and a second switching transistor of a first input portion. Into respective gates of the N-MOS's 1, 2 via input terminals 3, 4 are respectively input a first CMOS level signal A constituting the CMOS level differential signal and a second CMOS level signal AN constituted as an inverted signal of the signal A. The N-MOS's 1, 2 are alternately turned ON/OFF by these CMOS level differential signals.

Respective drains of the N-MOS's 1, 2 are connected respectively to a first node N1 and a second node N2, and respective sources of them are then connected to a common node N3. Gates of P-MOS's 5, 6 both forming a current mirror circuit are connected to the first node N1. A drain of the P-MOS 6 serving as the output side of the current mirror circuit is in turn connected to an output terminal 7 (first output node). Because of the current mirror circuit, a current output from the P-MOS 6 (output current) is about n times larger than a current output from the P-MOS 5 if the ratio of transistor size between the P-MOS's 5, 6 is set to be G5:G6=1:n (where G5, G6 denote respectively gate widths of the P-MOS's 5, 6).

Gates of P-MOS's 8, 9 both forming a current mirror circuit are likewise connected to the second node N2. A drain of the P-MOS 9 serving as the output side of the current mirror circuit is in turn connected to an output terminal 10 (second output node). Because of the current mirror circuit, a current output from the P-MOS 9 (output current) is about n times larger than a current output from the P-MOS 8 if the ratio of transistor size between the P-MOS's 8, 9 is designed to be G8:G9=1:n (where G8, G9 denote respectively gate widths of the P-MOS's 8, 9).

A drain of an N-MOS 11 (first current controlling transistor) whose conduction state is controlled by a first current control signal RF1 is then connected to the common node N3. A source of the N-MOS 11 is in turn connected to a ground power source Vss. Moreover, a drain of an N-MOS 12 (second current controlling transistor) whose conduction state is controlled by a second current control signal RF2 is connected to the first node N1. A source of the N-MOS 12 is in turn connected to a ground power source Vss. A drain of an N-MOS 13 (third current controlling transistor) whose conduction state is controlled by a second current control signal RF2 is likewise connected to the second node N2. A source of the N-MOS 13 is then connected to a ground power source Vss.

Consequently, if being combined together, a current output from the N-MOS 12 and a current output from the N-MOS 1 would result in a current output from the P-MOS 5. In the same way, a current output from the P-MOS 8 would be derived by combining a current output from the N-MOS 13 with a current output from the N-MOS 2.

A power source Vt (3 V) is further connected to the output terminals 7, 10 via respective resistances Rt. A first PECL level signal Z which being a differential signal at the PECL level (3.3 V to 4.1 V) and a second PECL level signal ZN which being an inverted signal of the signal Z are in turn output from the output terminals 7, 10 respectively. Resistances Rt are impedance-matched respectively with characteristic impedances Zt of the transmission lines. As a result, the resistance Rt arranged on the output terminal 7 side and the P-MOS's 5, 6 may constitute a first conversion output portion, while the resistance Rt arranged on the output terminal 10 side and the P-MOS's 8, 9 may constitute a second conversion output portion.

The output current (Ioh) may be given by the expression (4.1–3)/Rt when it is output at an "H" level, whereas the output current (Iol) may be given by the expression (3.3–3)/Rt when it is output at an "L" level. The current output from the N-MOS 12 may thus be given as Ioh/n, which being substantially identical to the current output from the N-MOS 13. As stated above, both currents from the N-MOS's 12, 13 can be controlled by the second current control signal RF2 which is supplied to respective gates of the N-MOS's 12, 13. The current output from the N-MOS 11 may also be given as the expression (Ioh–Iol)/n. As previously stated, the current output from the N-MOS 11 can also be controlled by the first current control signal RF1 which being supplied to the gate of the N-MOS 11. The first and second current control signals RF1, RF2 may be generated by a replica bias circuit to compensate for variations in manufacturing processes and operational conditions of LSI's, and the like.

Subsequently an operation of the level conversion circuit constituted as aforementioned will be explained.

When the CMOS level signals A (="L" level), AN (="H" level) are input into the input terminals 3, 4, the N-MOS 1 is turned OFF while the N-MOS 2 is turned ON. This causes the current output from the P-MOS 5 to be Iol/n, which being identical to the current output from the N-MOS 12. Since, because of function of the current mirror circuit, an output current Iol which is n times larger than that from the P-MOS 5 is output as the current from the P-MOS 6, the PECL level signal Z at an "L" level may be output to the output terminal 7.

At this time, the current output from the P-MOS 8 can be obtained as Ioh/n which being a combined current of the currents output from the N-MOS 13 and the N-MOS 11. Since, because of function of the current mirror circuit, the output current Ioh which is n times as large as the current from the P-MOS 8 flows out from the P-MOS 9, the PECL level signal ZN at an "H" level is output to the output terminal 10.

On the other hand, when the CMOS level signals A (="H" level), AN (="L" level) are input into the input terminals 3, 4, then in the same manner as above the PECL level signal Z at an "H" level is output from the output terminal 7 and the PECL level signal ZN at an "L" level is also output from the output terminal 10.

Figure 4:
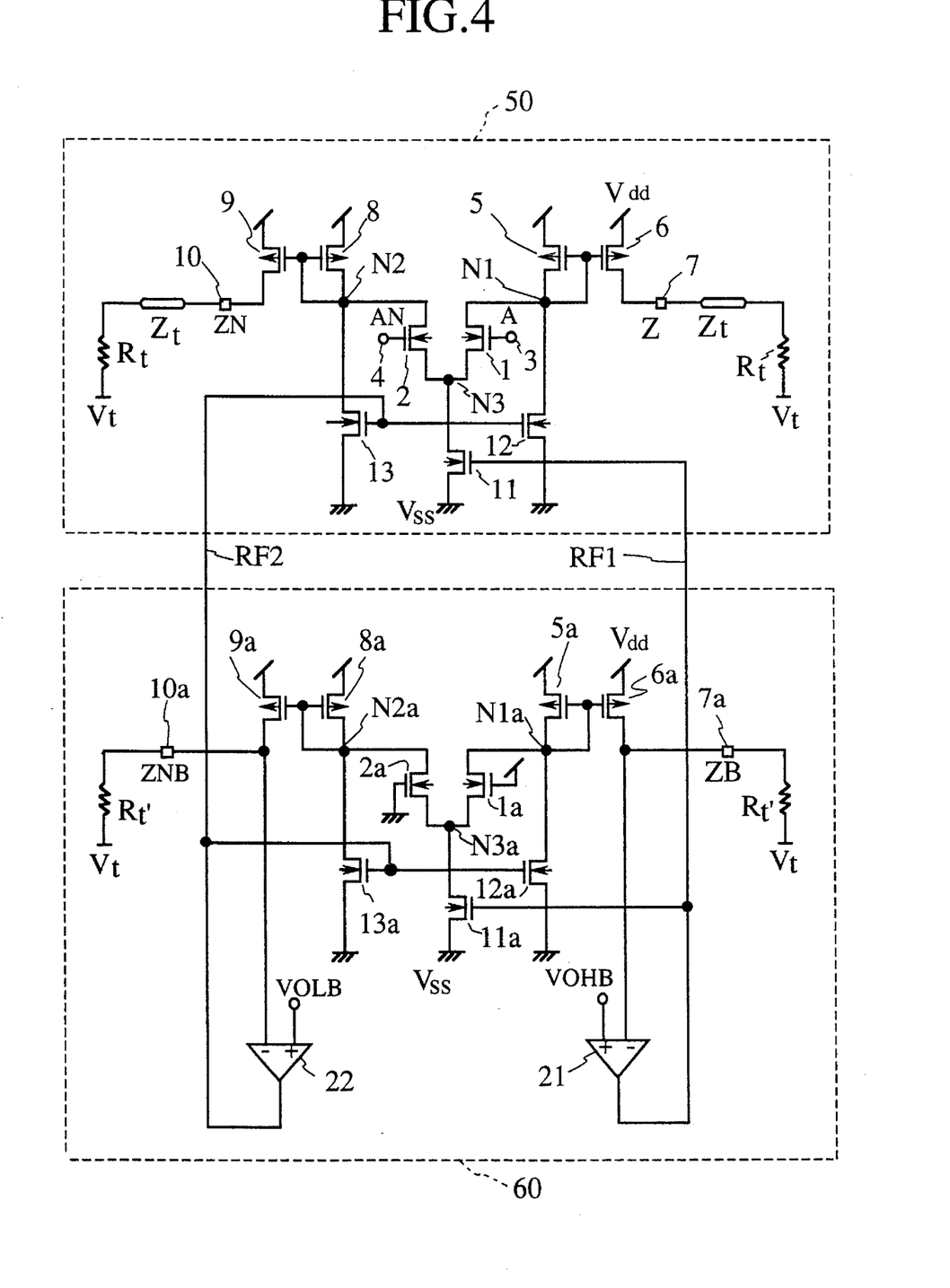
FIG. 4 is a circuit diagram showing a CMOS-PECL level conversion circuit of the first embodiment including a replica bias circuit.

FIG. 4 is a circuit diagram showing a CMOS-PECL level conversion circuit according to the embodiment in which a replica bias circuit for generating the current control signals RF1, RF2 is provided.

The CMOS-PECL level conversion circuit is so formed that it may employ the level conversion circuit shown in FIG. 3 as a level conversion portion 50, to which a replica bias circuit 60 for generating the current control signals RF1, RF2 is in turn connected.

The replica bias circuit 60 includes a circuit having the same configuration as that of the level conversion portion 50 above. In other words, N-MOS's 1a, 2a (third and fourth switching transistors), P-MOS's 5a, 6a, P-MOS's 8a, 9a, N-MOS's 11a, 12a, 13a and the resistors Rt' are formed by the same manufacturing processes to have the same configuration (and also the same transistor sizes) as that formed of N-MOS's 1, 2, P-MOS's 5, 6, P-MOS's 8, 9, N-MOS's 11, 12, 13 and the resistances Rt in the above level conversion portion 50 respectively.

The first power source Vdd and the second power source Vss are then connected respectively to respective gates of the N-MOS's 1a, 2a both constituting the second input portion so as to change output signal levels of the bias circuit 60, i.e., to change the third PECL level signal ZB output to the output terminal 7a (third output node) into an "H" level and the fourth PECL level signal ZNB output to the output terminal 10a (fourth output node) into an "L" level.

Operational amplifiers 21, 22 (first and second signal generating means) are further provided in the bias circuit 60. The PECL level signal ZB is input into the negative polarity input side of the operational amplifier 21 while the reference voltage VOHB at an "H" level is input into the positive polarity input side of the amplifier 21. The first current control signal RF1 (first feedback signal) obtained as the output from the operational amplifier 21 is supplied to a gate of an N-MOS 11a. The control signal RF1 is thus fed back so that the PECL level signal ZB may be caused to be equal to the reference voltage VOHB.

The PECL level signal ZNB is similarly input into the negative polarity input side of the operational amplifier 22 while the reference voltage VOLB at an "L" level is input into the positive polarity input side of the amplifier 22. The second current control signal RF2 (second feedback signal) obtained as the output from the operational amplifier 22 is supplied to gates of N-MOS's 12a, 13a. The control signal RF2 is thus fed back so that the PECL level signal ZNB may be caused to be equal to the reference voltage VOLB.

The first and second current control signals RF1, RF2 (first and second feedback signals) respectively output from the operational amplifiers 21, 22 control the currents to achieve relations ZB=VOHB and ZNB=VOLB even if manufacturing processes, operational conditions, etc. are varied, and are also supplied to the level conversion portion 50.

The bias circuit 60 in the level conversion circuit shown in FIG. 4 is a replica bias circuit including the same configuration circuit as that of the level conversion portion 50, which may be formed by the same manufacturing processes as used in manufacturing the level conversion portion 50. Therefore, if variations occur in the operational conditions of the level conversion portion 50, the variation components also occur in the same configuration circuit in the bias circuit 60. The current control signals RF1, RF2 are set to compensate for these variation components. The output currents Ioh, Iol from the level conversion portion 50 may be controlled by the current control signals RF1, RF2. In other words, "H" and "L" levels of the PECL level signals Z, ZN may be determined.

If manufacturing processes of LSI's and operational conditions such as power source, temperature, characteristic impedance of the transmission line are varied, the output voltages (PECL level signals Z, ZN) from the level conversion portion 50 are scarcely varied.

In the present embodiment, since the current control signals RF1, RF2 which are set depending upon the variations are kept constant, the currents from N-MOS's 11, 12, 13 may also be kept constant. It may be switched merely by the signals A, AN that the current from the N-MOS's 11 should be output either to the N-MOS 1 side or to the N-MOS 2 side to output the PECL level signals Z, ZN, thus enabling a high speed operation.

In case a plurality of level conversion circuits are further needed, only one bias circuit may be provided.

Although DC current paths appear in the present embodiment, it becomes possible that currents in the circuit may be reduced if the size ratios (G5:G6, G8:G9) of the transistors (P-MOS's 5, 6, P-MOS's 8, 9) forming the current mirror circuits are increased.

Figure 5:
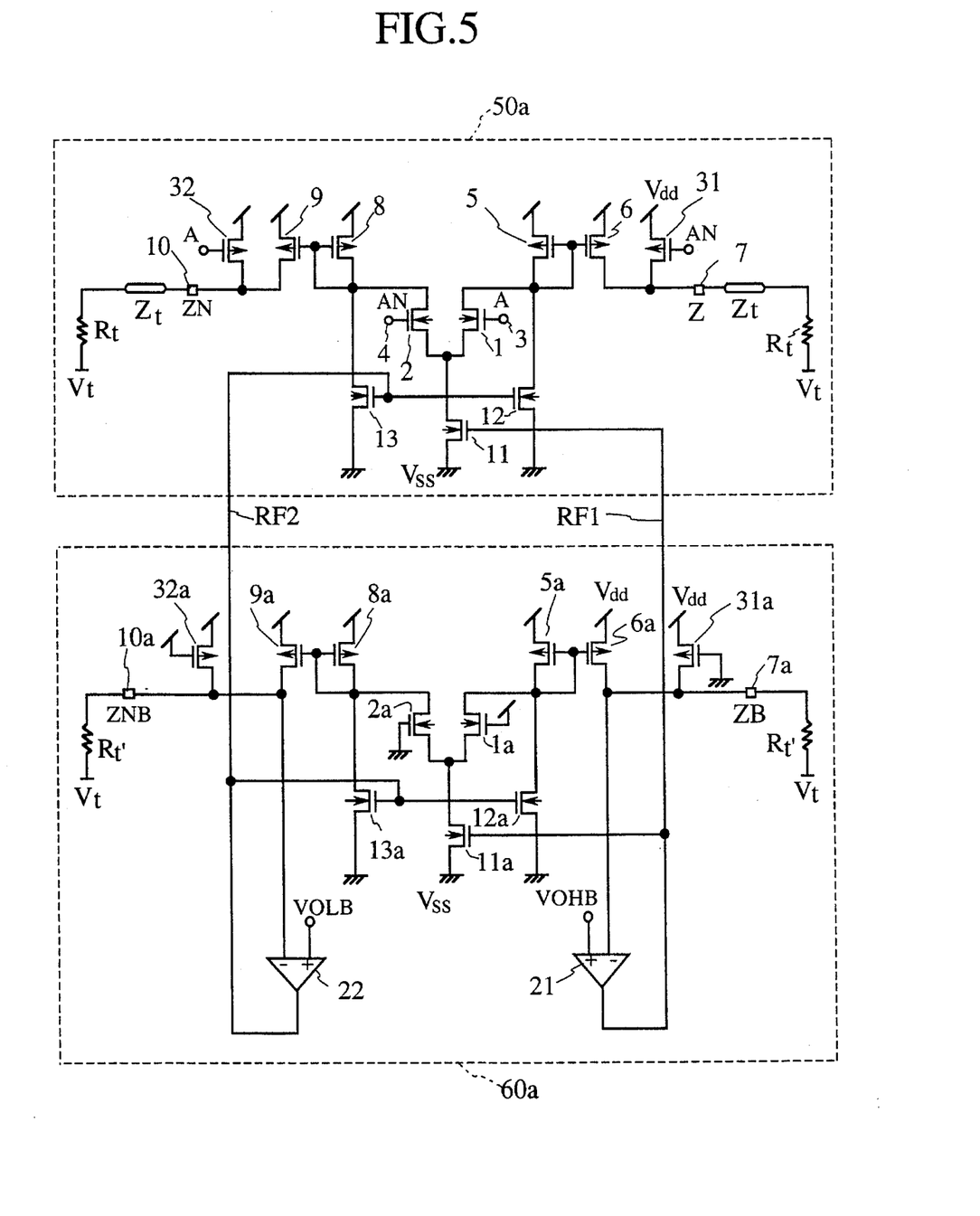
FIG. 5 is a circuit diagram showing a level conversion circuit according to a second embodiment of the present invention.

FIG. 5 is a circuit diagram showing a level conversion circuit according to a second embodiment of the present invention. In FIG. 5, the identical references are used to describe identical elements in FIG. 4 and their explanation may therefore be omitted.

As described earlier, in the level conversion circuit according to the first embodiment, power consumption may also be reduced if the size ratios of the transistors used in the current mirror circuit are increased. However, in the second embodiment, power consumption can be much more reduced than the first embodiment by providing therein low power consumption transistors which are turned ON when outputting the "H" level signal.

More specifically, in the level conversion portion 50 illustrated in FIG. 4 above, a level conversion portion 50a comprises a P-MOS 31 (first low power consumption transistor) and a P-MOS 32 (second low power consumption transistor). The P-MOS 31 is connected between the power source Vdd and the output terminal 7 and is ON/OFF-controlled by the CMOS level signal AN. The P-MOS 32 is connected between the power source Vdd and the output terminal 10 and is ON/OFF-controlled by the CMOS level signal A.

In the bias circuit 60, the replica bias circuit 60a also comprises a P-MOS 31a (third low power consumption transistor) and a P-MOS 32a (fourth low power consumption transistor). The P-MOS 31a is connected between the power source Vdd and the output terminal 7a, and its control electrode is then connected to the power source Vss. The P-MOS 32a is connected between the power source Vdd and the output terminal 10a, and its control electrode is connected to the power source Vdd. Here the P-MOS's 31, 32, 31a, 32a are formed to have the same configuration.

In the first embodiment, the output current Ioh at an "H" level flows entirely through the P-MOS 6 or the P-MOS 9 of the current mirror circuit, but part of the output current Ioh is made to flow through the P-MOS 31 or the P-MOS 32, i.e., low power consumption transistor, in the second embodiment. The current flowing through the P-MOS 6 or the P-MOS 9 may thus be reduced to result in reduction of power consumption in the circuit. In this event, the current from the low power consumption transistors must be designed smaller than the output current Ioh.

Figure 6:
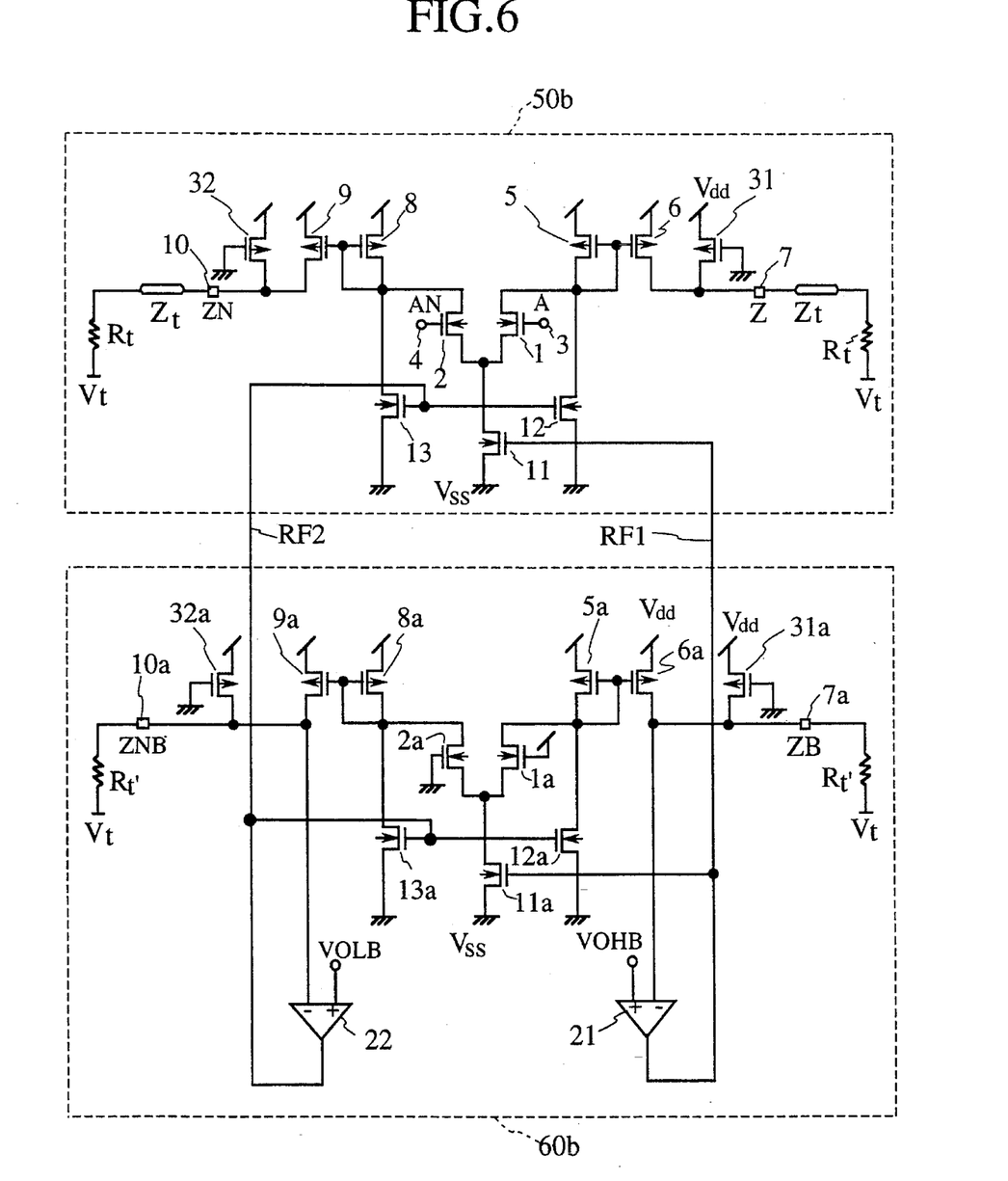
FIG. 6 is a circuit diagram showing a level conversion circuit according to a third embodiment of the present invention.

FIG. 6 is a circuit diagram showing a level conversion circuit according to a third embodiment of the present invention. In FIG. 6, the identical references are also used to describe identical elements in FIG. 5 and their explanation may therefore be omitted.

In a level conversion circuit according to the third embodiment, a level conversion portion 50b and a bias circuit 60b may be formed by connecting control electrodes of the P-MOS's 31, 32, 31a, 32a used in the circuit shown in FIG. 5 (second embodiment) to the second power source Vss. Low power consumption can thus be achieved.

In the level conversion circuit according to the third embodiment, since the low power consumption transistors P-MOS's 31, 32, 31a, 32a are in a normal ON state, part of the output currents Iol, Ioh are caused to flow through the low power consumption transistors. The current from the P-MOS 6 or the P-MOS 9 in the current mirror circuit may thereby be reduced, which leads to reduction of power consumption in the circuit. In this event, the current from the low power consumption transistors must be set smaller than the output current Iol.

Figure 7:
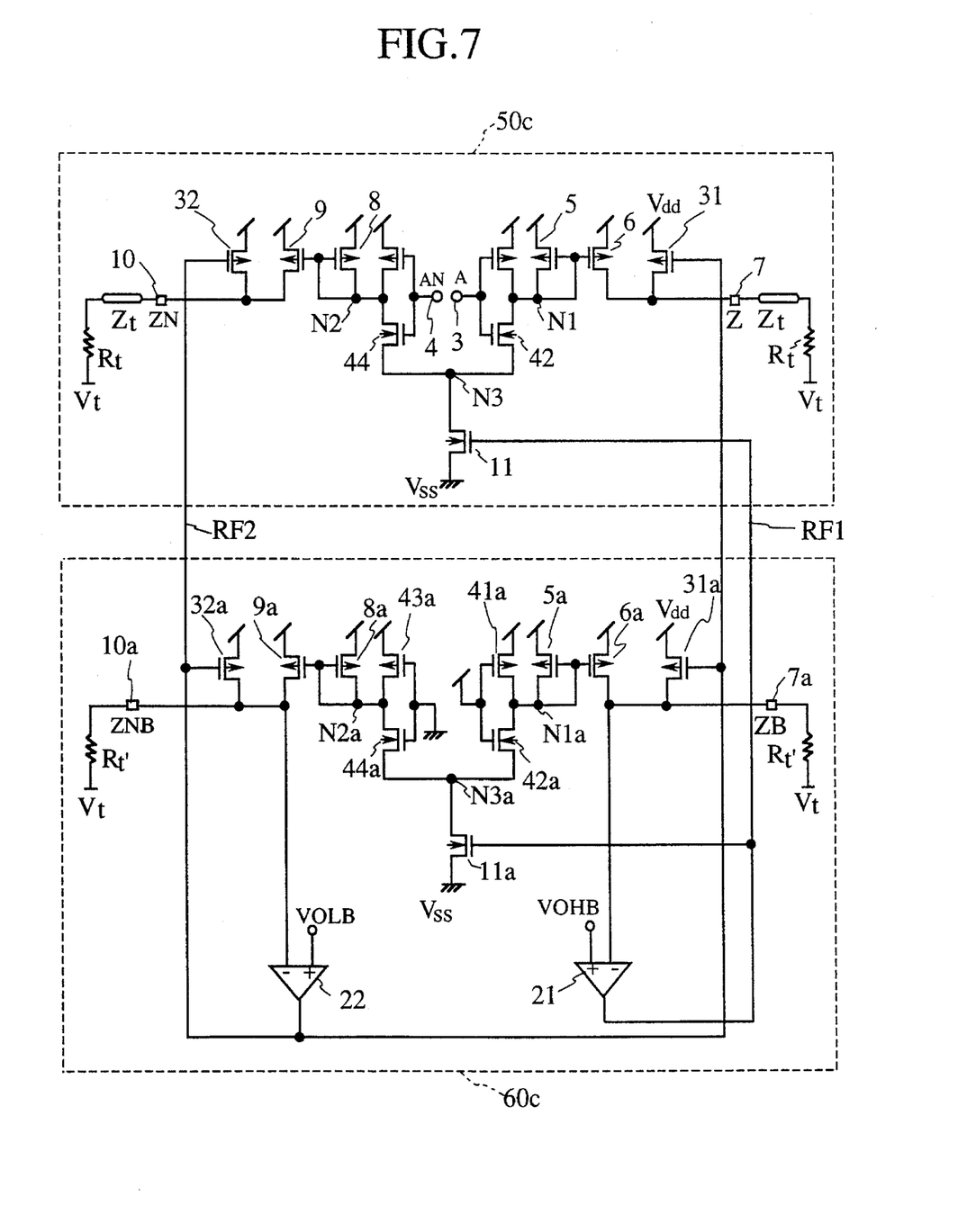
FIG. 7 is a circuit diagram showing a level conversion circuit according to a fourth embodiment of the present invention.

FIG. 7 is a circuit diagram showing a level conversion circuit according to a fourth embodiment of the present invention.

In the level conversion circuit according to the fourth embodiment, the PECL level signals Z, ZN output as the output voltages may also be stabilized while maintaining low power consumption and a high speed operation even if the above operational conditions are varied.

In more detail, as shown in FIG. 7, the level conversion portion 50c of the fourth embodiment comprises a first CMOS inverter consisting of a P-MOS 41 and an N-MOS 42, and a second CMOS inverter consisting of a P-MOS 43 and an N-MOS 44 instead of the input portion constituting the N-MOS's 1, 2 in the level conversion portion 50b in FIG. 5. The N-MOS's 12, 13 serving as the current control transistors in FIG. 5 have been removed.

According to the above, a bias circuit 60c will be configured as aforementioned. In other words, the bias circuit 60c comprises a third CMOS inverter consisting of a P-MOS 41a and an N-MOS 42a, and a fourth CMOS inverter consisting of a P-MOS 43a and an N-MOS 44a. The N-MOS's 12a, 13a are removed.

The P-MOS's 31, 32 serving respectively as the first and second output transistors are constituted to be ON/OFF-controlled by the second current control signal RF2 which is supplied from the operational amplifier 22. In addition, the P-MOS's 31a, 32a on the bias circuit 60c side are also constituted to be ON/OFF-controlled by the second current control signal RF2.

In the fourth embodiment, a first conversion output portion comprises a current mirror circuit formed of the P-MOS's 5, 6, a first output transistor P-MOS 31, and the resistor Rt whereas a second conversion output portion comprises a current mirror circuit formed of the P-MOS's 8, 9, a second output transistor P-MOS 32, and the resistor Rt. A third and fourth conversion Output portions are also provided in correspondence to these output portions on the bias circuit 60c side.

In the level conversion circuit according to the fourth embodiment, the output current Iol may be output by controlling the P-MOS's 31, 32 based on the current control signal RF2, without using the current mirror circuit. The P-MOS's 31, 32 contribute up to the current Iol of the output current Ioh, and remaining current of the output current Ioh is controlled by the current control signal RF1 in terms of the current mirror circuit. Since the currents from the transistors forming the current mirror circuits may thereby be reduced, power consumption in the circuit can also be reduced.

Several approaches for achieving low power consumption discussed in the above second through fourth embodiments may be utilized in combination.

As have been described in detail above, according to the present invention, it is feasible that the first and second PECL level signals of the output voltages are stabilized even if manufacturing processes of LSI's and operational conditions such as power source voltage, temperature, characteristic impedance of the transmission line are varied.

The foregoing description of preferred embodiments has been presented for purposes of illustration and description.

It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A level conversion circuit for converting CMOS level differential signals into PECL level differential signals, comprising:

a first input portion for receiving a first CMOS level signal as a differential signal at said CMOS level and a second CMOS level signal formed as an inverted signal of said first CMOS level signal, and outputting a first output current and a second output current based on these signals;

a first conversion output portion for outputting a first PECL level signal as said PECL level differential signal and a second PECL level signal as an inverted signal of said first PECL level signal based on said first output current and said second output current from said first input portion; and a first current control portion for controlling said first output current and said second output current in said first conversion output portion by a first current control signal and a second current control signal so as to determine a high level and a low level in said first PECL level signal and said second PECL level signal.

2. A level conversion circuit as claimed in claim 1, further comprising:

a second input portion, a second conversion output portion, and a second current control portion, all being formed to have respectively the same configurations as those of said first input portion, said first conversion output portion, and said first current control portion;

a first signal generating means for generating a first feedback signal based on a third PECL level signal output from said second conversion output portion;

a second signal generating means for generating a second feedback signal based on a fourth PECL level signal output as an inverted signal of said third PECL level signal from said second conversion output portion; and a replica bias circuit formed to feed back said first feedback signal and said second feedback signal to said second current control portion, and to employ an input signal supplied to said second input portion as a first power source and a second power source;

wherein said first feedback signal and said second feedback signal output from said replica bias circuit may serve respectively as said first current control signal and said second current control signal.

3. A level conversion circuit comprising:

a first switching transistor and a second switching transistor connected respectively between a first node and a common node and a second node and said common node, for effecting ON/OFF operations alternately based on a first CMOS level signal serving as a CMOS level differential signal and a second CMOS level signal formed as an inverted signal of said first CMOS level signal;

a first conversion output portion for outputting a first PECL level signal of PECL level differential signals to a first output node depending upon a current flowing through said first node;

a second conversion output portion for outputting a second PECL level signal formed as an inverted signal of said first PECL level signal to a second output node depending upon a current flowing through said second node;

a first current control transistor for controlling a current to flow through said common node based on a first current control signal;

a second current control transistor for controlling a current to flow through said first node based on a second current control signal; and a third current control transistor for controlling a current to flow through said second node based on said second current control signal.

4. A level conversion circuit as claimed in claim 3, further comprising:

a third switching transistor and a fourth switching transistor, a fourth current control transistor through a sixth current control transistor, and a third conversion output portion and a fourth conversion output portion, all being formed to have respectively the same configurations as those of said first switching transistor and said second switching transistor, said first current control transistor through said third current control transistor, and said first conversion output portion and said second conversion output portion;

a first signal generating means for generating a first feedback signal based on a third PECL level signal output from said third conversion output portion to a third output node;

a second signal generating means for generating a second feedback signal based on a fourth PECL level signal output as an inverted signal of said third PECL level signal from said fourth conversion output portion to a fourth output node; and a replica bias circuit formed to feed back said first feedback signal to a control electrode of said fourth current control transistor and said second feedback signal to control electrodes of said fifth current control transistor and said sixth current control transistor, and to connect respectively a first power source and a second power source to respective control electrodes of said third switching transistor and said fourth switching transistor;

wherein said first feedback signal output from said replica bias circuit is supplied as said first current control signal to a control electrode of said first current control transistor, and said second feedback signal is supplied respectively as said second current control signal to respective control electrodes of said second current control transistor and said third current control transistor.

5. A level conversion circuit as claimed in claim 4, further comprising:

a first low power consumption transistor connected between said first power source and said first output node, conduction of said first low power consumption transistor being controlled based on said second CMOS level signal; and a second low power consumption transistor connected between said first power source and said second output node, conduction of said second low power consumption transistor being controlled based on said first CMOS level signal;

wherein said replica bias circuit comprises:

a third low power consumption transistor connected between said first power source and said third output node and formed to have the same configuration as that of said first low power consumption transistor, a control electrode of said third low power consumption transistor being connected to said second power source; and a fourth low power consumption transistor connected between said first power source and said fourth output node and formed to have the same configuration as that of said second low power consumption transistor, a control electrode of said fourth low power consumption transistor being connected to said first power source.

6. A level conversion circuit as claimed in claim 5, wherein control electrodes of said first low power consumption transistor through said fourth low power consumption transistor are connected to said second power source.

7. A level conversion circuit for receiving CMOS level differential signals from a first input terminal and a second input terminal and converting said CMOS level differential signals into PECL level differential signals to output from a first output terminal and a second output terminal, comprising:

a first CMOS inverter connected between a first power source and a common node, for receiving one of said CMOS level differential signals as an input signal;

a first current mirror circuit having an input current terminal connected to an output terminal of said first CMOS inverter and an output current terminal connected to said first output terminal;

a second CMOS inverter connected between said first power source and said common node, for receiving the other of said CMOS level differential signals as an input signal;

a second current mirror circuit having an input current terminal connected to an output terminal of said second CMOS inverter and an output current terminal connected to said second output terminal;

a first current control transistor connected between said common node and a second power source, for controlling a current flowing through said common node based on a first current control signal;

a first output transistor connected between said first power source and said first output terminal, conduction of said first output transistor being controlled based on a first current control signal; and a second output transistor connected between said first power source and said second output terminal, conduction of said second output transistor being controlled based on a second current control signal.

8. A physical layer controller for an ATM communication control apparatus comprising:

a signal transfer processing section for receiving transmission data from upper data link layers and converting said transmission data into pulse trains at a CMOS level to output them at predetermined transfer rate; and a CMOS-PECL level conversion circuit for converting said pulse trains at said CMOS level from said signal transfer processing section into pulse trains at a PECL level to output them as differential signals;

wherein said CMOS-PECL level conversion circuit comprises:

a first input portion for receiving a first CMOS level signal as said differential signals at said CMOS level and a second CMOS level signal formed as an inverted signal of said first CMOS level signal and outputting a first current and a second current based on said first CMOS level signal and said second CMOS level signal;

a first conversion output portion for outputting a first PECL level signal formed as said PECL level differential signals and a second PECL level signal formed as an inverted signal of said first PECL level signal based on a first output current and a second output current from said first input portion; and a first current control portion for controlling a first output current and a second output current from said first conversion output portion by a first current control signal and a second current control signal to determine a high level and a low level of said first PECL level signal and said second PECL level signal respectively.

* * * * *